Feb. 25, 1958 HUO-BING YIN 2,824,964

SEMI-CONDUCTOR OSCILLATOR CIRCUITS

Filed June 28, 1955

INVENTOR.
HUO-BING YIN

BY H. C. Newton

ATTORNEY 2,824,964

SEMI-CONDUCTOR OSCILLATOR CIRCUITS

Huo-Bing Yin, Collingswood, N. J., assignor to Radio Corporation of America, a corporation of Delaware Application June 28, 1955, Serial No. 518,460

6 Claims. (Cl. 250—36)

Figure 1:
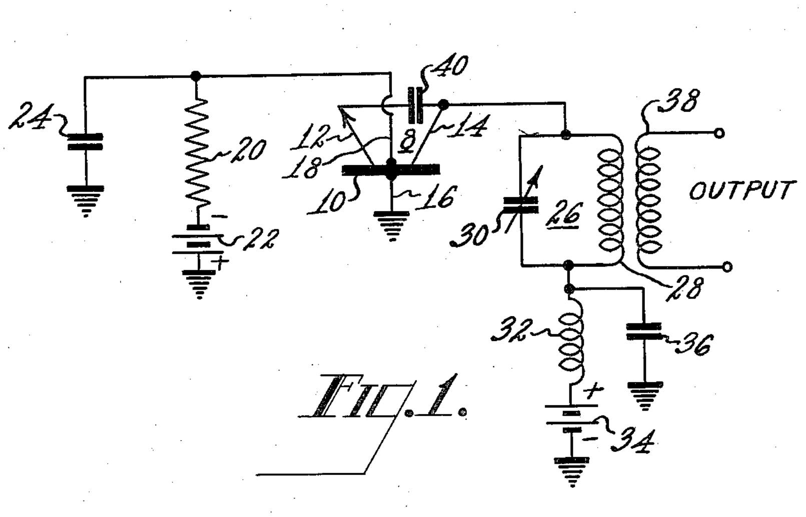

This invention relates to electrical signal generator or oscillator circuits, and in particular to circuits of that type utilizing semi-conductor devices, such as transistors as operative elements therein. More particularly, the present invention relates to oscillator circuits utilizing tetrode transistors, that is, transistors having four electrodes.

In order to produce sustained oscillations by electrical means, it is necessary to feed back a portion of the output signal from a signal amplifying device, whether it be an electron tube or a transistor, to the input circuit of the device. To this end, many of the known oscillator circuits contain an external feedback path which couples signal energy from the output circuit to the input circuit of the amplifying device of proper phase and amplitude to sustain continuous oscillation.

In other oscillator circuits, a reduction in the number of required circuit components and hence circuit simplicity is achieved by utilizing the interelectrode capacitances of the signal amplifying device to provide the feedback necessary for oscillation. In still other oscillator circuits, a device having a negative resistance characteristic is utilized, and by properly connecting a tuned circuit across the negative resistance, sustained oscillation is achieved. This latter method has been utilized with success in oscillator circuits using point-contact transistors and also results in circuit simplicity. For high frequency applications, however, such as those required for television receiving systems, for example, it is often difficult to obtain high frequency oscillations with circuits which require but a minimum number of circuit components.

It is, accordingly, an object of the present invention to provide an improved oscillator circuit utilizing a four-electrode junction transistor.

It is another object of this invention to provide an improved semi-conductor circuit for generating sustained relatively high frequency sine-wave oscillations and which includes relatively few circuit components.

It is yet another object of the present invention to provide an improved very high frequency oscillation generator utilizing a tetrode transistor, which may provide reliable operation with relatively simple circuit construction.

These and further objects and advantages of the present invention are achieved by utilizing the negative resistance characteristic of the collector circuit of a tetrode transistor. It has been found, in accordance with the invention, that a suitable negative resistance characteristic can be obtained in a tetrode transistor by suitably biasing the normal and auxiliary base electrodes of the device and open circuiting the emitter electrode. This negative resistance characteristic may be effectively utilized to generate sustained oscillation. By capacitively coupling the emitter directly with the collector, however, in accordance with the invention, circuit operation may be improved and very high frequency oscillations obtained.

Figure 2:
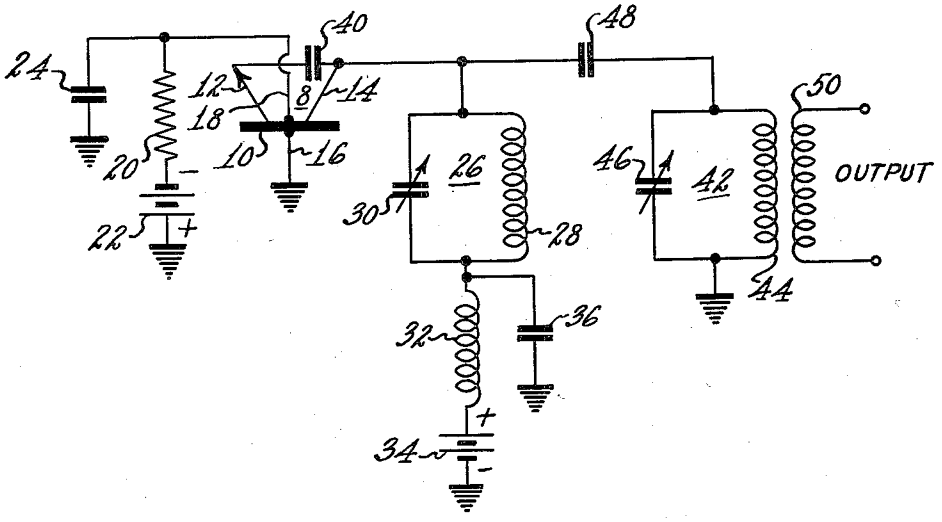

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1 and 2 are schematic circuit diagrams of oscillator circuits utilizing tetrode transistors and embodying two possible forms of the present invention.

Referring now to the drawing, wherein like parts are indicated by like reference numerals in both figures, and referring particularly to Figure 1, an oscillator circuit embodying the invention includes a transistor 8, which may be considered to be an N-P-N junction transistor of the tetrode type. The tetrode transistor includes a semiconductive body 10, with which four electrodes are cooperatively associated in a well known manner. These electrodes are designated, as is conventional, as an emitter 12, a collector 14 and a first and second base electrode 16 and 18 which may be referred to as a normal base electrode 16 and an auxiliary base electrode 18. The construction and characteristics of transistors of this type have been described in an article by Wallace et al. in the November 1952 issue of the Proceedings of the I. R. E., starting on page 1395. While the tetrode transistor 8 has been illustrated as being P type conductivity, it could also be of N type conductivity, that is, a P-N-P junction transistor, so long as the polarity of the various required biasing voltages were reversed.

The first or normal base 16 of the transistor 8 is connected directly to a point of reference potential or ground. Alternatively, it could be connected through a suitable by-passed resistor to ground. The auxiliary base 18 is connected through a suitable resistor 20 to the negative terminal of a source of direct-current biasing voltage, such as illustrated by a battery 22, the positive terminal of which is grounded. The resistor 20 and the battery 22 are by-passed by a capacitor 24 which is connected from the junction of the auxiliary base 18 and the resistor 20 to ground.

Suitable frequency determining means for the oscillator circuit are provided by provision of a parallel resonant tank circuit 26 comprising an inductor 28 and a capacitor 30, which may be variable as shown for tuning the oscillator circuit to the desired fundamental frequency of operation. The upper or high frequency end of the tank circuit 26 is connected as shown to the collector 14 of the transistor. The lower end of the tank circuit 26 is connected through a suitable radio frequency choke 32 to the positive terminal of a source of direct current biasing voltage, such as illustrated by a battery 34, the negative terminal of which is grounded. The choke 32 and the battery 34 are by-passed by a capacitor 36 which is connected from the junction of the tank circuit 26 and the choke 32 to ground. The generated oscillations may be derived from any suitable point in the oscillator circuit. Preferably, they are inductively coupled from the inductor 28 of the tank circuit. To this end, an output winding 38 is provided which is inductively coupled to the inductor 28 of the tank circuit 26.

As was mentioned hereinbefore, it has been discovered, in accordance with the invention, that the collector circuit of a tetrode transistor will exhibit a negative resistance characteristic over a portion of its operating range if suitable biasing voltages are applied to its normal and auxiliary base electrodes and its emitter electrode is open circuited. To most effectively utilize this negative resistance characteristic and to provide optimum circuit operation for the oscillator circuit, in accordance with this invention, a capacitor having a small capacitance is used to couple the emitter of the tetrode transistor with its collector. Accordingly, in Figure 1, a capacitor 40 is coupled directly between the emitter 12 and the collector 14 of the transistor 8.

The capacitor 40, in a typical example, may have a capacitance of from 2 to 4 micromicrofarads. By connecting the capacitor 40 as shown, that is, between the emitter and the collector of the transistor, and by using to advantage the collector circuit negative resistance of the transistor, it has been found that high frequency, stable and sustained sine-wave oscillations of relatively high amplitude may be generated. This is accomplished, moreover, by a circuit in which a minimum number of circuit components are utilized and the circuit connections therefor are relatively simple. A circuit in accordance with the invention has been found moreover, to operate over a relatively wide range of frequencies, which may be tuned by varying the capacity of the capacitor 30. In addition, emitter biasing is not required and it has been found that the required biasing voltages between the base electrodes of the transistor is less critical than that required in conventional tetrode transistor oscillator circuits. The oscillator signals so generated may be derived from across the coupling winding 38 and used, for example, to supply the local oscillator signals in a television receiver.

An oscillator circuit constructed in accordance with the teachings of the present invention has been found to contain a considerable number of harmonic frequency signals in its collector circuit. In Figure 2, this characteristic has been utilized to advantage to obtain even higher frequency operation by coupling a second frequency determining tank circuit with the collector 14 of the transistor. This tank circuit will normally be tuned to the frequency of the harmonic signal which it is desired to derive from the circuit. To accomplish this, a second parallel resonant tank circuit 42 is provided which includes an inductor 44 and a capacitor 46, which may be variable as shown to tune the tank circuit to the desired harmonic frequency.

The lower end of the tank circuit 42 is grounded while its upper end is coupled through a capacitor 48 to the collector 14 of the transistor 8. The circuit illustrated in Figure 2 is in other respects identical to the circuit illustrated in Figure 1 and is operative in substantially the same manner and with similar advantages. It can be used in those applications where oscillator signals of even a higher frequency than those obtainable by the circuit of Figure 1 are desired. The harmonic frequency signals so generated may be coupled from the inductor 44 of the harmonic frequency tank circuit to an output circuit. In order to accomplish this a coupling winding 50 is provided which is inductively coupled to the inductor 44 of the harmonic frequency tank circuit 42.

Oscillator circuits constructed in accordance with the teachings of this invention require a minimum number of circuit components and relatively simple circuit connections for generating high frequency oscillations. Accordingly, the invention provides oscillator circuits particularly suited for high frequency circuit applications where circuit simplicity together with reliable and stable circuit operation are required or desired.

What is claimed is:

1. A high frequency sine wave oscillator circuit comprising, in combination, a semi-conductor device having a collector, an emitter, a normal base and an auxiliary base electrode, means for applying energizing potentials solely to said normal base, auxiliary base, and collector electrodes to provide a negative resistance characteristic in the collector circuit of said semi-conductor device, a frequency determining circuit connected with said collector electrode, and a coupling capacitor connected between said emitter electrode and the junction of said collector electrode and said frequency determining circuit.

2. In a high frequency sine wave oscillator circuit including means providing a point of reference potential therein and a tetrode transistor having a collector, an emitter, a normal base and an auxiliary base electrode, the combination comprising, means providing a first source of energizing potential connected between said auxiliary base electrode and said point of reference potential, means connecting said normal base electrode with said point of reference potential, a frequency determining circuit connected with said collector electrode, means providing a second source of energizing potential connected between said frequency determining circuit and said point of reference potential, said first and second sources of energizing potential being effective to apply biasing voltages solely to said collector, normal base, and auxiliary base electrodes to provide a negative resistance characteristic in the collector circuit of said tetrode transistor, and a coupling capacitor connected between said emitter electrode and the junction of said collector electrode and said frequency determining circuit to enhance said negative resistance characteristic and provide optimum operation of said oscillator circuit.

3. In a sine wave oscillator, the combination with a tetrode transistor having an emitter, a collector, a normal base electrode and an auxiliary base electrode, of means for applying energizing potentials solely to said auxiliary base, normal base, and collector electrodes, a frequency determining circuit for the oscillator connected with said collector electrode and tunable to a predetermined operating frequency, and means providing a negative resistance characteristic for said transistor over a portion of its operating range including said first named means and a capacitor connected from said emitter electrode to the junction of said collector electrode and said frequency determining circuit.

4. In a sine-wave oscillator, the combination with a tetrode transistor having an emitter, a collector, a normal base electrode and an auxiliary base electrode, of means for applying energizing potentials solely to said auxiliary base, normal base and collector electrodes, a first frequency determining circuit for said oscillator connected with said collector electrode and tunable for response to an oscillator signal of a predetermined fundamental frequency, a second frequency determining circuit for said oscillator coupled with the junction of said first frequency determining circuit and said collector electrode and tunable for response to an oscillator signal of a harmonic frequency of said fundamental frequency, and means providing a negative resistance characteristic for said transistor over a portion of its operating range including said first named means and a capacitor connected from said emitter electrode to the junction of said collector electrode and said first frequency determining circuit.

5. In a very high frequency sine-wave oscillator circuit including means providing a point of reference potential therein and a tetrode transistor having a collector, an emitter, a normal base and an auxiliary base electrode, the combination comprising, means providing a first source of energizing potential connected between said auxiliary base electrode and said point of reference potential, means connecting said normal base electrode with said point of reference potential, a first frequency determining parallel resonant circuit connected with said collector electrode and tunable to a predetermined fundamental oscillator frequency, means providing a second source of energizing potential connected between said first frequency determining circuit and said point of reference potential, said first and second sources of energizing potential being effective to apply biasing voltages solely to said collector, normal base, and auxiliary base electrodes to provide a negative resistance characteristic in the collector circuit of said tetrode transistor, a second frequency determining parallel resonant circuit coupled to the junction of said collector electrode and said first frequency determining parallel resonant circuit and tunable to a harmonic frequency of said fundamental oscillator frequency, means enhancing said negative resistance characteristic for said transistor over a portion of its operating range including a capacitor connected from said emitter electrode to the junction of said collector electrode and said first frequency determining parallel resonant circuit, and output circuit means coupled with said second frequency determining circuit for deriving therefrom a sinusoidal output wave at a frequency determined by the resonant frequency of said second frequency determining circuit.

6. A harmonic generator comprising, in combination, a four electrode semi-conductor device having a collector, an emitter, a normal base and an auxiliary base electrode, means for applying energizing potentials solely to said auxiliary base, normal base, and collector electrodes to provide a negative resistance characteristic in the collector circuit of said semi-conductor device, a first frequency determining circuit connected with said collector electrode and tuned to a predetermined fundamental oscillator frequency, a second frequency determining circuit capacitively coupled to the junction of said collector electrode and said first frequency determining circuit and tuned to a predetermined harmonic frequency of said fundamental oscillator frequency, and a coupling capacitor connected between said emitter electrode and the junction of said collector electrode and said first frequency determining circuit.

References Cited in the file of this patent

"High Frequency Transistor Tetrode," by Wallace et al.: pages 112–113 of Electronics for January 1953.

"Commercial Tetrode Transistors," page 83 of Tele-Tech and Electronic Industries for May 1954.